(12) United States Patent
Tokeshi et al.

(10) Patent No.: US 11,523,540 B2
(45) Date of Patent: Dec. 6, 2022

(54) COOLING DEVICE

(71) Applicant: Nidec Corporation, Kyoto (JP)

(72) Inventors: Toshihiko Tokeshi, Kyoto (JP); Nobuya Nakae, Kyoto (JP); Takehito Tamaoka, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 36 days.

(21) Appl. No.: 17/147,502

(22) Filed: Jan. 13, 2021

(65) Prior Publication Data

US 2021/0136958 A1 May 6, 2021

Related U.S. Application Data

(63) Continuation of application No. 16/689,177, filed on Nov. 20, 2019, now Pat. No. 10,917,995.

(30) Foreign Application Priority Data

Dec. 28, 2018 (JP) .............................. JP2018-248651

(51) Int. Cl.
*H05K 7/20* (2006.01)
*F28D 15/00* (2006.01)
(Continued)

(52) U.S. Cl.
CPC .......... *H05K 7/20509* (2013.01); *B23P 15/26* (2013.01); *F28D 15/00* (2013.01);
(Continued)

(58) Field of Classification Search
CPC ..... H01L 23/473; H01L 23/3672; G06F 1/20; H05K 7/20927; H05K 7/20509;
(Continued)

(56) References Cited

U.S. PATENT DOCUMENTS

2006/0249278 A1* 11/2006 Liu ..................... H01L 23/473
257/E23.098
2007/0012423 A1* 1/2007 Kinoshita ............. H01L 23/473
257/722
(Continued)

FOREIGN PATENT DOCUMENTS

JP 2018-049861 A 3/2018

OTHER PUBLICATIONS

Tokeshi et al., "Cooling Device", U.S. Appl. No. 16/689,177, filed Nov. 20, 2019.
(Continued)

*Primary Examiner* — Adam B Dravininkas
(74) *Attorney, Agent, or Firm* — Keating & Bennett

(57) ABSTRACT

A cooling device includes a cooling plate with a bottom wall portion with a lower surface which contacts a heat-generating component, a top wall portion which covers an upper surface of the bottom wall portion, a side wall portion which couples the bottom wall portion and the top wall portion, and an internal space which is surrounded by the bottom wall portion, the top wall portion, and the side wall portion to define a first cooling medium flow passage. The bottom wall portion includes blades on the upper surface. An inlet port or an outlet port is on one end side of the first cooling medium flow passage. An inner peripheral wall of the side wall portion includes a first bent portion which is bent convex inward between ends of the blades and the at least one of the inlet port and the outlet port.

18 Claims, 7 Drawing Sheets

(51) Int. Cl.
    *H01L 23/367* (2006.01)
    *H01L 23/473* (2006.01)
    *B23P 15/26* (2006.01)

(52) U.S. Cl.
    CPC ........ *H01L 23/3672* (2013.01); *H01L 23/473* (2013.01); *H05K 7/20254* (2013.01)

(58) Field of Classification Search
    CPC ........... H05K 7/20254; H05K 7/20218; H05K 7/20272; H05K 7/2039; H05K 7/20145; H05K 7/20154; H05K 7/20327; H05K 7/209; H05K 7/20436
    See application file for complete search history.

(56) References Cited

U.S. PATENT DOCUMENTS

| | | | | |
|---|---|---|---|---|
| 2010/0128436 | A1* | 5/2010 | Edmunds | F28D 15/0233 165/104.26 |
| 2018/0124949 | A1* | 5/2018 | Marroquin | H01L 23/427 |
| 2018/0340736 | A1* | 11/2018 | Mounioloux | F28D 1/05391 |
| 2019/0053403 | A1* | 2/2019 | Lin | H01L 23/427 |
| 2019/0075681 | A1* | 3/2019 | Xiao | F28D 1/05375 |
| 2019/0204023 | A1* | 7/2019 | Takken | H05K 7/20254 |
| 2019/0307019 | A1* | 10/2019 | Nakae | H05K 7/20254 |
| 2019/0307020 | A1* | 10/2019 | Nakae | F28F 3/12 |

OTHER PUBLICATIONS

Official Communication issued in corresponding Chinese Patent Application No. 201911358530.2, dated Jul. 27, 2021.

\* cited by examiner

COOLING DEVICE

CROSS REFERENCE TO RELATED APPLICATION

The present invention claims priority under 35 U.S.C. § 119 to Japanese Application No. 2018-248651 filed on Dec. 28, 2018, the entire contents of which application are incorporated herein by reference.

1. Field of the Invention

The present disclosure relates to a cooling device.

2. Background

A conventional cooling device includes a cold plate. For example, there is a cold plate including: a lid body having a cooling medium inlet through-hole and a cooling medium outlet through-hole; and a base plate having a lower surface to be connected to a heat-generating component. On the upper surface of the base plate, a plurality of plate-shaped fins are provided. A space formed between the inner face of the lid body and the main face of the cold plate forms a flow path for a cooling medium.

The cooling medium that has flowed from the cooling medium inlet through-hole into the space formed between the inner face of the lid body and the main face of the cold plate exchanges heat with the plate-shaped fins and flows out through the cooling medium outlet through-hole. In this way, the heat-generating component is cooled.

However, in the above-described cooling device, the base plate has a rectangular shape in a top view, and the strength is low in a non-formation region where the plate-shaped fins are not provided directly below the cooling medium inlet through-hole and the cooling medium outlet through-hole. For this reason, there is a problem that when the lower surface of the base plate is brought into contact with a heat-generating component, the base plate deforms in the non-formation region where the plate-shaped fins are not formed.

SUMMARY

An example embodiment of a cooling plate according to the present invention includes a bottom wall portion with a lower surface which comes into contact with a heat-generating component, a top wall portion which covers an upper surface of the bottom wall portion, a side wall portion which couples the bottom wall portion and the top wall portion, and an internal space which is surrounded by the bottom wall portion, the top wall portion, and the side wall portion to define a first cooling medium flow passage. The bottom wall portion includes blades on the upper surface. An inlet port or an outlet port is provided on one end side of the first cooling medium flow passage. An inner peripheral wall of the side wall portion includes a first bent portion which is bent convexly inward between ends of the blades and the inlet port or the outlet port.

Another example embodiment of a cooling plate according to the present invention includes a bottom wall portion with a lower surface which comes into contact with a heat-generating component, a blade region on a top surface of the bottom wall in which blades are provided, and a non-forming region on the top surface of the bottom wall corresponding to all remaining portions of the top surface in which none of the blades are provided. The non-forming region includes a first inclined portion that narrows in a side-to-side direction as the non-forming region extends away from one end of the blades.

The above and other elements, features, steps, characteristics and advantages of the present disclosure will become more apparent from the following detailed description of the example embodiments with reference to the attached drawings.

DETAILED DESCRIPTION

Hereinafter, example embodiments of the present disclosure will be described with reference to the drawings. In the present disclosure, a side on which a radiator 20 is disposed relative to a cold plate 10 is referred to as an "upper side" and a side opposite to the side on which the radiator 20 is disposed is referred to as a "lower side". In the present disclosure, a direction in which the radiator 20 is disposed relative to the cold plate 10 is referred to as a "vertical direction" of "up-and-down direction" and a direction orthogonal to the "vertical direction" is referred to as a "horizontal direction" or "side-to-side direction" for describing the shapes and positional relationships of the parts. This defines the vertical direction and the horizontal direction merely for the sake of description and does not limit the directions during manufacture and use of a cooling device 1 according to the present disclosure. In the present disclosure, a longitudinal direction and a lateral direction of the cold plate 10 in the top view are referred to as a "longitudinal direction X" and a "lateral direction Y", respectively.

In the present disclosure, a "parallel direction" includes a substantially parallel direction. In the present disclosure, an "orthogonal direction" includes a substantially orthogonal direction.

Figure 1:
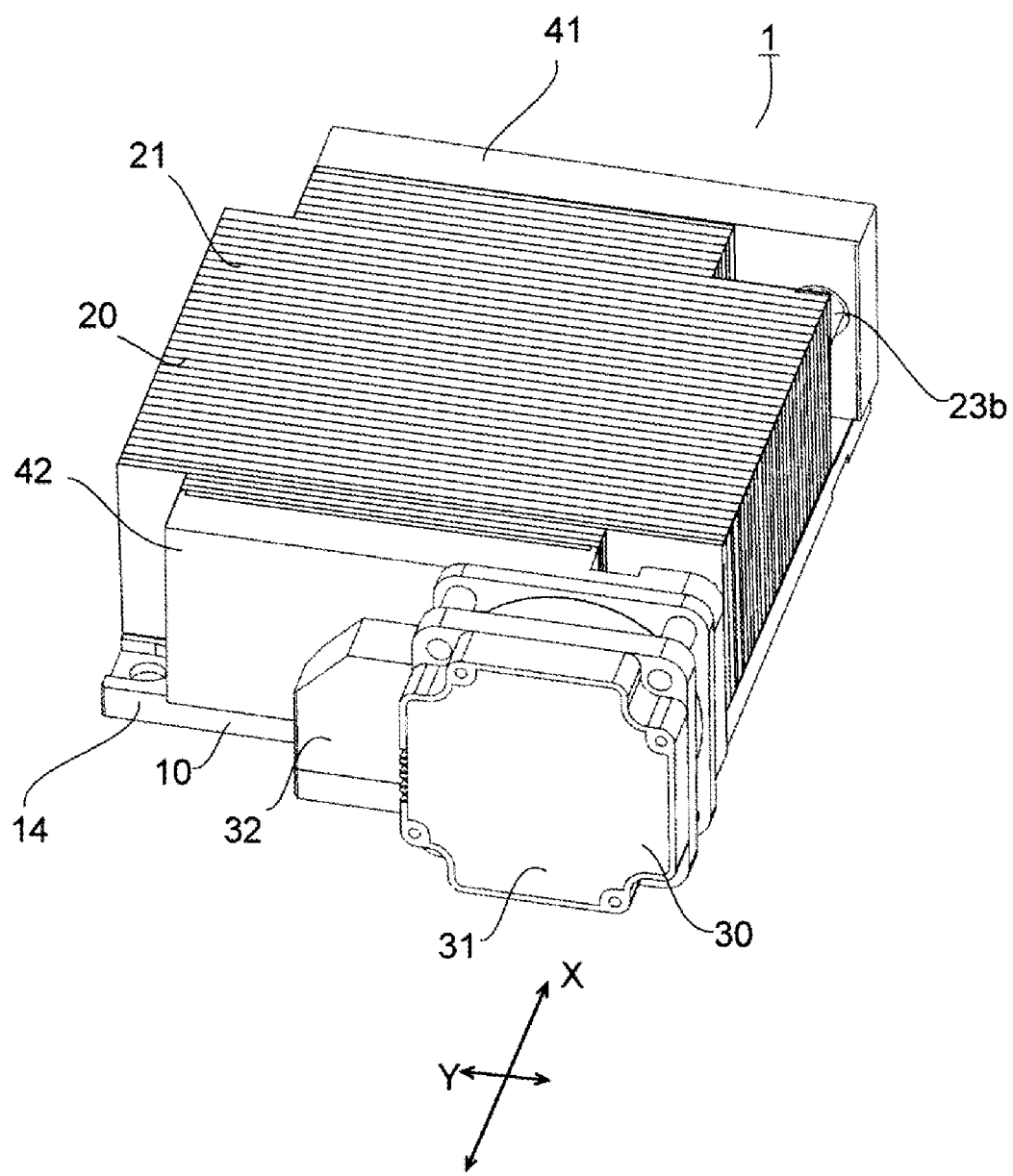
FIG. 1 is a top perspective view of a cooling device according to an example embodiment of the present disclosure.
Figure 2:
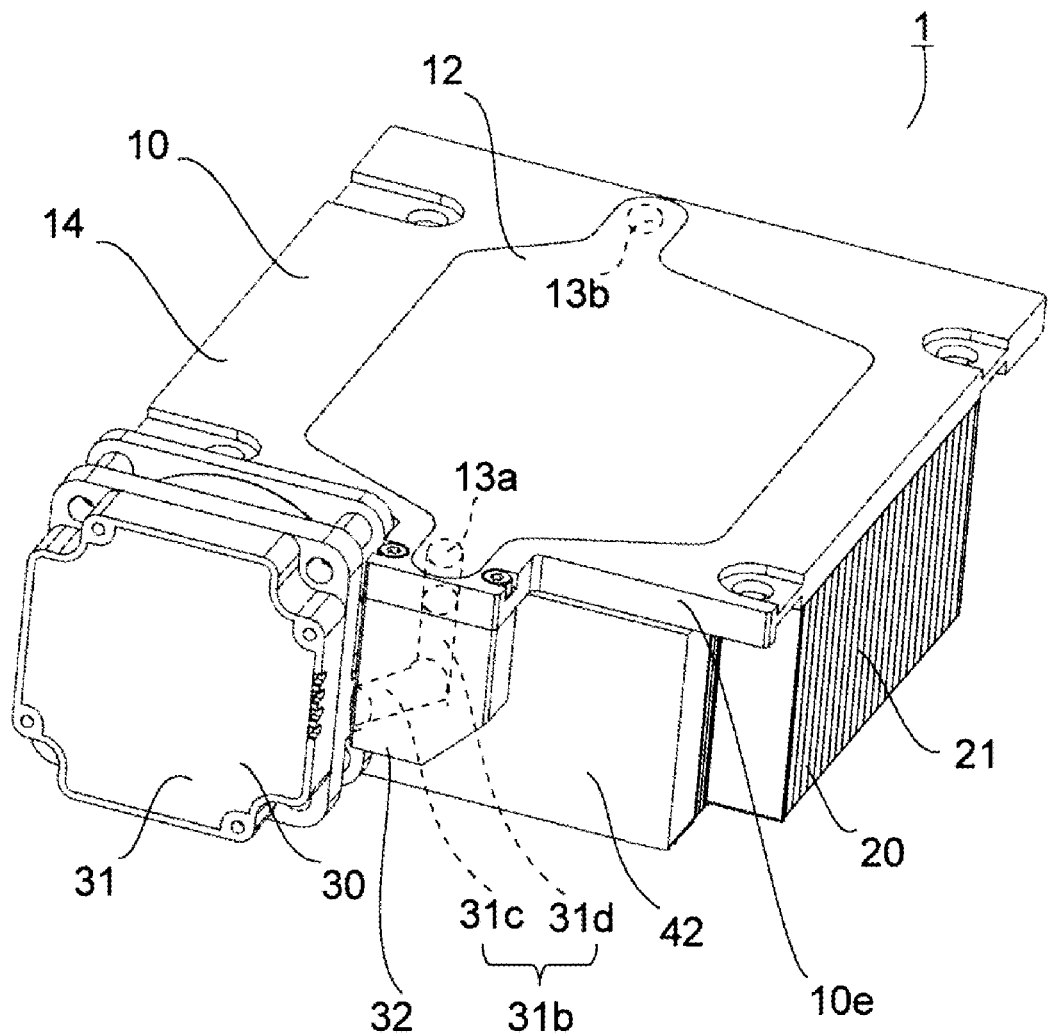
FIG. 2 is a bottom perspective view of the cooling device according to the example embodiment of the present disclosure.
Figure 3:
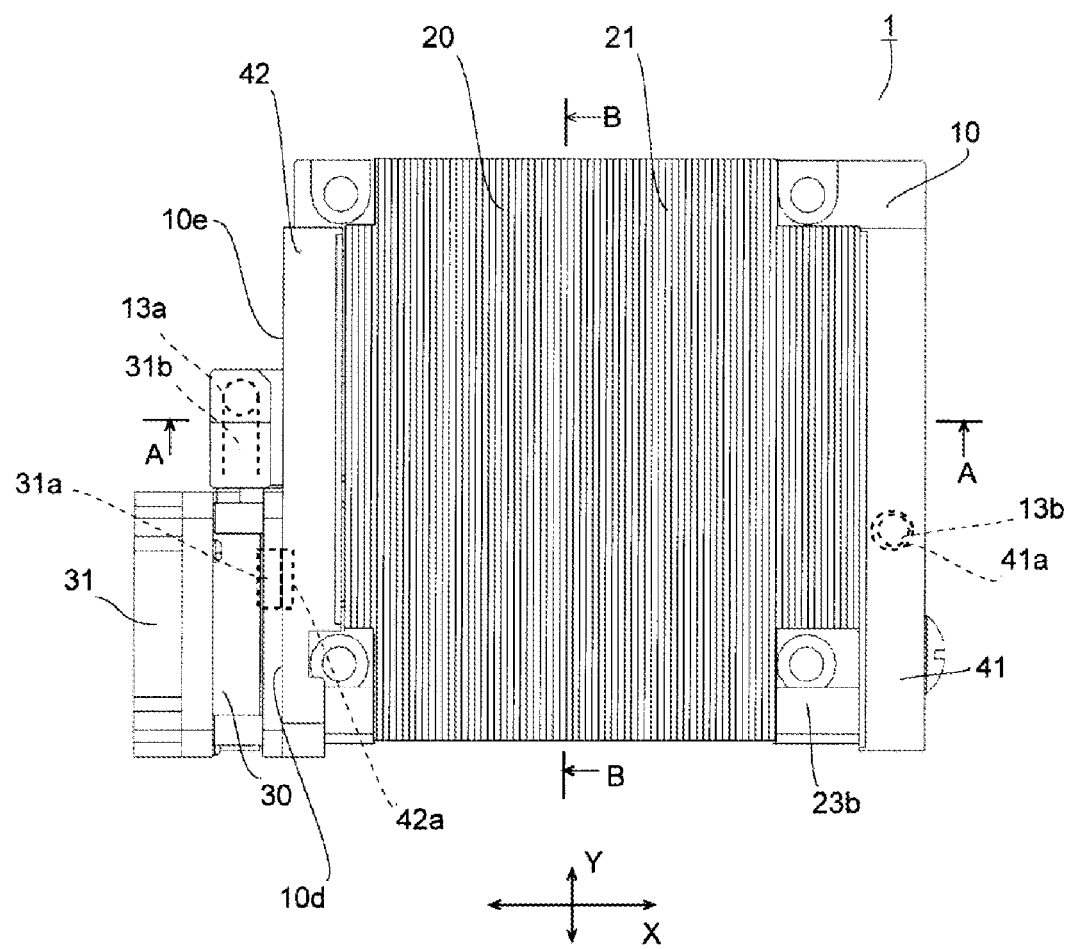
FIG. 3 is a top view of the cooling device according to the example embodiment of the present disclosure.
Figure 4:
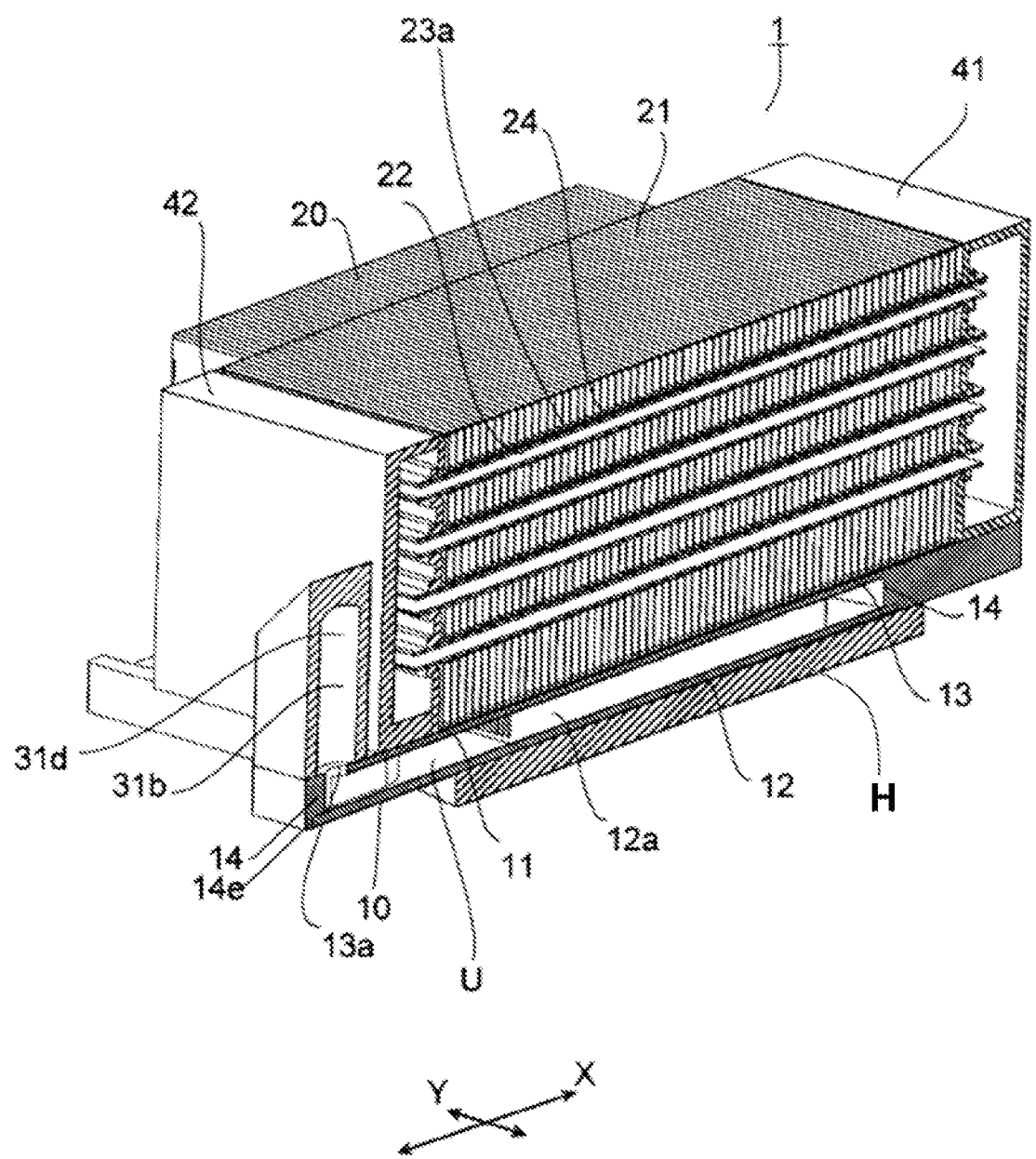
FIG. 4 is a perspective cross-sectional view taken along the line A-A in FIG. 3.
Figure 5:
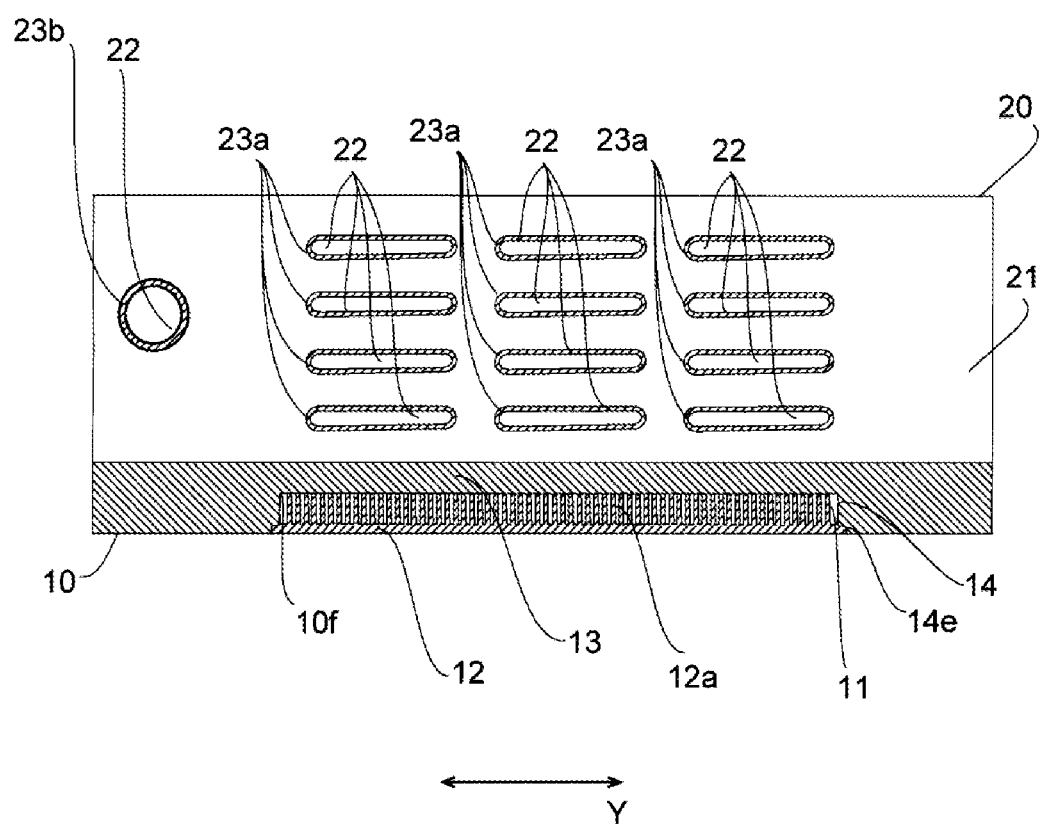
FIG. 5 is a cross-sectional view taken along the line B-B in FIG. 3.

A cooling device of an example embodiment of the present disclosure will be described. FIGS. 1 and 2 are a top perspective view and a bottom perspective view of a cooling device 1 according to the example embodiment of the present disclosure. FIG. 3 is a top view of the cooling device 1 and FIG. 4 is a perspective cross-sectional view taken along the line A-A in FIG. 3. FIG. 5 is a cross-sectional view taken along the line B-B in FIG. 3.

In FIG. 2, an inlet port 13*a*, an outlet port 13*b*, a discharge port 31*b*, an outward portion 31*c*, and a downward portion 31*d*, which are not seen from the appearance of the cooling device 1, are indicated by dashed lines. In FIG. 3, the inlet port 13*a*, the outlet port 13*b*, a suction port 31*a*, the discharge port 31*b*, a first tank through-hole 41*a*, and a second tank through-hole 42*a*, which are not seen from the appearance of the cooling device 1, are indicated by dashed lines.

The cooling device 1 includes a cold plate 10, a radiator 20, a first tank 41, a second tank 42, and a pump 30. The radiator 20, the first tank 41, and the second tank 42 are disposed on the cold plate 10. The lower surfaces of the radiator 20, the first tank 41, and the second tank 42 are in contact with the upper surface of the cold plate 10. The pump 30 is disposed adjacent to the side face of the cold plate 10 and the second tank 42. This makes it possible to integrate the cold plate 10, the radiator 20, the pump 30, the first tank 41, and the second tank 42 to reduce the size of the entire cooling device 1, thus improving the handleability of the entire cooling device 1.

Since the cold plate 10, the radiator 20, and the pump 30 are directly connected, members such as pipes for coupling these are reduced. In this way, the size of the cooling device 1 is further reduced. Hence, it is possible to easily attach the cooling device 1 to an actual machine. Note that the cold plate 10, the radiator 20, and the pump 30 may be coupled using shortened pipes or the like in a region on the cold plate 10.

The cold plate 10 is formed of a metal having a high thermal conductivity such as copper or aluminum, and has a bottom wall portion 12, a top wall portion 13, and a side wall portion 14. In the present example embodiment, the cold plate 10 is rectangular in the top view. The bottom wall portion 12 and the top wall portion 13 each have a plate shape expanding in the horizontal direction in the top view. Note that although the top wall portion 13 in the present example embodiment has a rectangular shape in the top view, the shape of the top wall portion 13 is not limited to this and may be for example a polygonal shape having a plurality of corners or a circular shape in the plan view. A heat-generating component H (see FIG. 4) comes into contact with the lower surface of the bottom wall portion 12.

In the cold plate 10, cut portions 10*d*, 10*e* are formed, which are respectively bent side portions of the side face on the lateral side in the top view. At least part of the pump 30 is disposed in the cut portion 10*d* to face the side face of the cold plate 10. This makes it possible to further reduce the size of the entire cooling device 1. It is possible to increase the size and output of the pump 30 in the limited space of the cooling device 1 while suppressing an increase in size of the entire cooling device 1.

The cold plate 10 has: a first cooling medium flow passage 11 in which a cooling medium flows; the bottom wall portion 12; the top wall portion 13; the side wall portion 14; an internal space U; the inlet port 13*a*; and the outlet port 13*b*. The lower surface of the bottom wall portion 12 comes into contact with the heat-generating component H. The top wall portion 13 covers the upper surface of the bottom wall portion 12. The side wall portion 14 couples the peripheral portion of the bottom wall portion 12 and the peripheral portion of the top wall portion 13. The internal space U is surrounded by the bottom wall portion 12, the top wall portion 13, and the side wall portion 14 to form the first cooling medium flow passage 11. The inlet port 13*a* is disposed on one end side of the first cooling medium flow passage 11, and the cooling medium flows into the inlet port 13*a*. The outlet port 13*b* is disposed on the other end side of the first cooling medium flow passage 11, and the cooling medium flows out of the outlet port 13*b*. Inside the first cooling medium flow passage 11, provided are a plurality of blades 12*a* which are disposed side by side in parallel.

In the present example embodiment, the side wall portion 14 is formed of a member integral with the top wall portion 13. The first cooling medium flow passage 11 is formed by a recess 10*f* which is formed in the member by a cutting process or the like to be depressed upward. The side wall portion 14 is formed on the outer periphery side of the recess 10*f*. The top wall portion 13 and the side wall portion 14 may be formed of separate members. At this time, the first cooling medium flow passage 11 is formed at an inner side of the side wall portion 14.

The side wall portion 14 has a step portion 14*e*, which is depressed outward, on a lower end portion of the inner peripheral surface. The step portion 14*e* is formed in an annular shape (see FIG. 6). The upper surface of the bottom wall portion 12 comes into contact with the lower surface of the step portion 14*e*. This makes it easy to position the bottom wall portion 12 when attaching the bottom wall portion 12 to the top wall portion 13. The bottom wall portion 12 and the step portion 14*e* are joined together by welding, for example.

At this time, the lower end surface of the side wall portion 14 and the lower surface of the bottom wall portion 12 are formed at the same height in the vertical direction. This makes the lower end surface of the side wall portion 14 and the lower surface of the bottom wall portion 12 flush with each other in the vertical direction. Hence, when the heat-generating component H is brought into contact with both of the lower end surface of the side wall portion 14 and the lower surface of the bottom wall portion 12, it is possible to bring the lower surface of the cold plate 10 and the contact face of the heat-generating component H into contact with no gap. This allows heat generated by the heat-generating component H to be efficiently transmitted to the lower surface of the cold plate 10. It is possible to cool the heat-generating component H by bringing the heat-generating component H which has the contact face larger than the bottom wall portion 12 into contact with the lower surface of the cold plate 10.

In the top wall portion 13, provided are the inlet port 13*a* and the outlet port 13*b* which penetrate the top wall portion in the vertical direction (see FIGS. 2 and 3). The cooling medium that has flowed into the first cooling medium flow passage 11 through the inlet port 13*a* flows out of the first cooling medium flow passage 11 through the outlet port 13*b*. In the present example embodiment, the cooling medium is a liquid, and for example, an antifreeze (an ethylene glycol aqueous solution, a propylene glycol aqueous solution, or the like), pure water, or the like is used.

The radiator 20 has a plurality of fins 21 and a plurality of pipes 23*a* and 23*b* for cooling (see FIG. 5). The fins 21 are formed in a flat plate shape, and stand upright from the upper surface of the top wall portion 13 and extend in the horizontal direction of the cold plate 10. In the present example embodiment, the cold plate 10 has the longitudinal direction X and the lateral direction Y, and the plurality of fins 21 extend in the lateral direction Y. The plurality of fins 21 are arranged in parallel at equal intervals in the longitudinal direction X of the cold plate 10.

The lower ends of the fins 21 are in contact with the upper surface of the top wall portion 13. This improves the thermal conductivity from the top wall portion 13 to the fins 21. Note that the fins 21 and the top wall portion 13 may be separate members or may be integrally formed as a single member. In the present example embodiment, the fins 21 are members separate from the top wall portion 13. The lower ends of the fins 21 are joined to the upper surface of the top wall portion 13 by welding, for example.

When the fins 21 are in the same member as the top wall portion 13, the fins 21 are formed by performing a cutting process on the upper surface of the top wall portion 13, for example. When the fins 21 and the top wall portion 13 are separate members, the fins 21 are preferably formed of a metal having a high thermal conductivity such as copper or aluminum as in the case of the above-described cold plate 10. Forming the fins 21 of a metal having a high thermal conductivity like the cold plate 10 makes it possible to efficiently transmit heat from the cold plate 10 to the fins 21.

The pipes 23a and 23b form a second cooling medium flow passage 22 which is hollow inside and through which the cooling medium flows. The second cooling medium flow passage 22 communicates with the first cooling medium flow passage 11. More specifically, the second cooling medium flow passage 22 communicates with the first cooling medium flow passage 11 through the pump 30, the first tank 41, and the second tank 42.

The pipes 23a and 23b extend straight in the longitudinal direction X of the cold plate 10. The pipe 23a is formed in a flat cross-section and the pipe 23b is formed in a circular cross-section. The pipes 23a and 23b are inserted through fin through-holes 24 provided in the plurality of fins 21 and fixed to the plurality of fins 21 by welding (see FIG. 4). Here, the direction in which the pipes 23a and 23b extend and the direction in which the fins 21 extend are orthogonal. That is, in the present example embodiment, the plurality of fins 21 extend in the lateral direction Y and the pipes 23a and 23b extend in the longitudinal direction X. Note that the directions in which the fins 21 and the pipes 23a and 23b extend are not limited to these, and for example, the pipes 23a and 23b may be disposed to be inclined relative to the direction in which the fins 21 extend.

One ends of the pipes 23a and 23b are coupled to the first tank 41 and the other ends of the pipes 23a and 23b are coupled to the second tank 42. The first tank 41 and the second tank 42 are disposed on the opposite sides in the direction in which the pipes 23a and 23b extend. This allows the cooling medium to smoothly flow straight from the first tank 41 to the second tank 42 through the pipes 23a and 23b.

The first tank 41 and the second tank 42 are disposed in parallel in the direction in which the fins 21 are arranged, and a larger number of fins 21 can be disposed at predetermined intervals between the first tank 41 and the second tank 42. This makes it possible to increase the surface area of the entire fins 21, improving the cooling performance of the radiator 20. The pipes 23a and 23b can be easily connected to the first tank 41 and the second tank 42.

The pipes 23a and 23b penetrate the side faces of the first tank 41 and the second tank 42 and are directly coupled to the first tank 41 and the second tank 42 (see FIG. 4). This makes it possible to reduce the number of components of the cooling device 1 and also to elongate the pipes 23a and 23b in the longitudinal direction X, so that the cooling medium can be efficiently cooled.

The pipes 23a are disposed side by side in 3 lines in the horizontal direction and also disposed side by side in 4 lines in the vertical direction. In this way, 12 pipes 23a in total are connected in parallel (see FIG. 4). One pipe 23b is disposed and connected in parallel with the pipes 23a.

In this way, the plurality of pipes 23a and 23b penetrate the fins 21, so that heat is transmitted from the pipes 23a and 23b to the fins 21. For this reason, it is possible to efficiently cool the cooling medium flowing through the pipes 23a and 23b while suppressing an increase in size of the cooling device 1.

Note that the flow rate of the cooling medium flowing through the plurality of pipes 23a can be adjusted by changing the diameter of the pipe 23b and the diameter of the pipe 23b is selected appropriately depending on the cooling device 1.

The total number of the pipes 23a and 23b is not limited and may be 12 or less or 14 or more. The plurality of pipes 23a do not necessarily have to be disposed at equal intervals and may be disposed such that the positions of the respective pipes 23a are different in the vertical direction.

The first tank 41 and the second tank 42 each are cuboidal. In the lower surface of the first tank 41, the first tank through-hole 41a is formed. The first tank through-hole 41a coincides with the outlet port 13b of the top wall portion 13 in the vertical direction and communicates with the outlet port 13b (see FIG. 3). The second tank 42 has the second tank through-hole 42a formed in the surface opposite to the surface in which the pipes 23a and 23b are coupled (see FIG. 3). The second tank through-hole 42a communicates with the suction port 31a of the pump 30 (see FIG. 3).

The pump 30 in the present example embodiment is a centrifugal pump having a passage for the cooling medium inside a cuboid casing 31 (not illustrated). An impeller (not illustrated) is disposed in the passage. Specifically, the pump 30 has the impeller as described later. In the casing 31, the suction port 31a is formed in one of adjacent side faces and the discharge port 31b is formed in the other of the adjacent side faces. The discharge port 31b protrudes outward from the side face of the casing 31 and communicates with the inlet port 13a (see FIG. 2).

The cooling device 1 includes a discharge portion 32. The discharge portion 32 is a member made of a metal which is screwed to the cold plate 10. The discharge portion 32 has the discharge port 31b. The discharge port 31b is formed by performing a cutting process on the discharge portion 32. That is, the discharge portion 32 having the discharge port 31b is a member separate from the casing 31. A pipe (not illustrated) that communicates with the passage inside the casing 31 and protrudes from the side face of the casing 31 is inserted into the discharge port 31b. In this way, the casing 31 and the discharge portion 32 are coupled, so that the passage inside the casing 31 and the inlet port 13a communicate through the discharge port 31b. The discharge portion 32 in the present example embodiment is a member made of a metal; however, this is exemplary and the discharge portion 32 may be formed of a member of rubber or the like.

The discharge port 31b has the outward portion 31c and the downward portion 31d. The outward portion 31c extends outward from the side face of the casing 31 and is inclined downward as separating from the casing 31. The downward portion 31d extends downward from the front end of the outward portion 31c. This makes it possible to shorten the discharge port 31b in the lateral direction Y, reducing the size of the entire cooling device 1.

Forming the discharge portion 32 of a member separate from the casing 31 makes it possible to easily connect the pump 30 and the cold plate 10 through the discharge portion 32 even when the position of the inlet port 13a is changed in the horizontal direction. Only the direction in which the discharge port 32 extends has to be designed and there is no need to change in design the direction in which the cooling medium is discharged from the pump 30. For this reason, the manufacturing cost of the cooling device 1 can be reduced. Note that although in the present example embodiment, the outward portion 31c extends downward as separating from the casing 31, the outward portion 31c may extend in the horizontal direction.

The impeller of the pump 30 is supported to be rotatable about a central shaft. The central shaft extends in the direction in which the cooling medium flows in the second cooling medium flow passage 22 and is coupled to a rotary shaft of a motor (not illustrated). The drive of the motor rotates the impeller to discharge, from the discharge port 31b, the cooling medium which has flowed from the suction port 31a.

The pump 30 sucks the cooling medium in the direction in which the second cooling medium flow passage 22 extends through the suction port 31a (see FIG. 3). This allows the cooling medium which has flowed into the second tank 42 from the pipes 23a and 23b to smoothly flow into the suction port 31a. Hence, it is possible to smoothen the flow of the cooling medium and reduce the power consumption of the pump 30.

Figure 6:
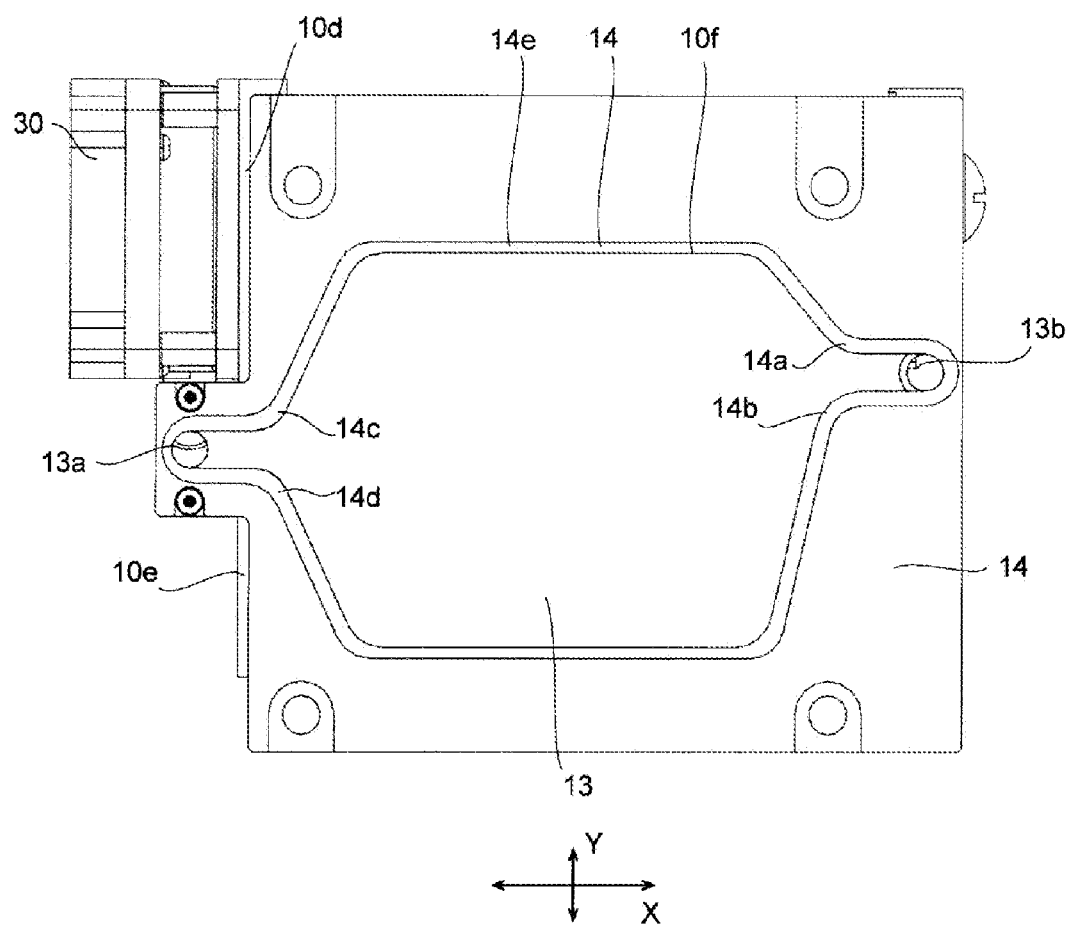
FIG. 6 is a bottom view illustrating a top wall portion and a side wall portion of a cold plate of the cooling device according to the example embodiment of the present disclosure.
Figure 7:
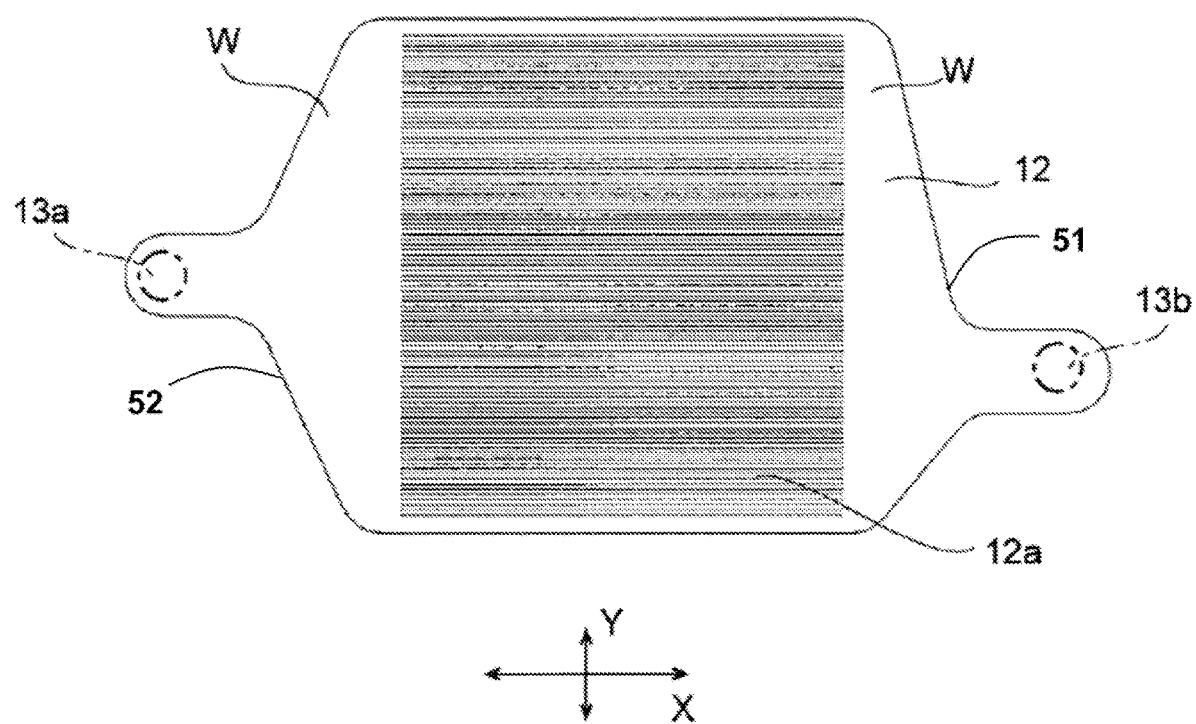
FIG. 7 is a top view illustrating a bottom wall portion of the cold plate of the cooling device according to the example embodiment of the present disclosure.

FIG. 6 is a bottom view of the top wall portion 13 and the side wall portion 14 which are formed integrally, and FIG. 7 is a top view of the bottom wall portion 12. Note that in FIG. 7, the dashed-dotted lines indicate the inlet port 13a and the outlet port 13b provided in the top wall portion 13. In the top wall portion 13, the cut portions 10d and 10e are formed, which are respectively bent side portions of the side face on the lateral side. The inlet port 13a is disposed between the cut portions 10d and 10e.

The bottom wall portion 12 has the plurality of blades 12a on the upper surface. The plurality of blades 12a extend in the longitudinal direction X of the cold plate 10 and are disposed side by side in parallel at equal intervals in the lateral direction Y. The upper ends of the blades 12a and the lower surface of the top wall portion 13 are in contact (see FIG. 5). This allows the cooling medium to flow through the space surrounded by the adjacent blades 12a, the top wall portion 13, and the bottom wall portion 12. Hence, it is possible to efficiently transmit heat generated by the heat-generating component H to the cooling medium through the blades 12a. When the heat-generating component H is brought into contact with the lower surface of the bottom wall portion 12, the bottom wall portion 12 is supported through the blades 12a. This makes it possible to prevent the bottom wall portion 12 from being deformed. Non-formation regions W where the blades 12a are not provided are formed in the bottom wall portion 12 directly below the inlet port 13a and the outlet port 13b.

The inner peripheral wall of the side wall portion 14 has bent portions (a first bent portion) 14a, 14b and bent portions (a second bent portion) 14c, 14d. The bent portions 14a, 14b are bent to be convex inward between one ends of the blades 12a and the outlet port 13b. The bent portions 14c, 14d are bent to be convex inward between the other ends of the blades 12a and the inlet port 13a.

This brings the inner peripheral wall of the side wall portion 14 closer to both ends of the blades 12a, making it possible to reduce the area of the non-formation region W. The bottom wall portion 12 is supported by the side wall portion 14 outside the bent portions 14a, 14b, 14c, 14d. This makes it possible to increase the strength of the bottom wall portion 12.

Since the bottom wall portion 12 is disposed on the annular step portion 14e extending along the inner peripheral wall of the side wall portion 14, the outer peripheral surface of the bottom wall portion 12 is bent inward corresponding to the bent portions 14a, 14b, 14c, 14d. This makes it possible to further increase the strength of the bottom wall portion 12.

Hence, it is possible to reduce the deflection of the bottom wall portion 12 and thus prevent the lower surface of the cold plate 10, which comes into contact with the heat-generating component H, from being deformed.

The bent portions 14a, 14b, 14c, 14d are each bent in a curved form in the top view. Specifically, part of each bent portion 14a, 14b, 14c, 14d is curved inward. This makes it possible to reduce the flow resistance of the cooling medium flowing through the first cooling medium flow passage 11. Note that although in the present example embodiment, each bent portion 14a, 14b, 14c, 14d is bent in a curved form in the top view, the bent portion may be bent in a straight form in the top view. In this case, while the flow resistance of the cooling medium flowing through the first cooling medium flow passage 11 is increased, the strength of the bottom wall portion 12 is increased.

The bent portions 14c, 14d are disposed on both sides of the inlet port 13a in the direction in which the blades 25 are arranged. The bent portions 14c, 14d are formed symmetrically in the horizontal direction with the inlet port 13a disposed in between in the top view. This allows the cooling medium which has flowed out of the inlet port 13a to uniformly spread in the lateral direction Y.

The first cooling medium flow passage 11 is formed to become wider in the horizontal direction as extending from the inlet port 13a toward the other ends of the blades 12a and as extending from the outlet port 13b toward the ends of the blades 12a due to a first inclined portion 51 that narrows in a side-to-side direction extending away from the ends of the blades 12a and a second inclined portion 52 which narrows in the side-to-side direction extending away from the other ends of the blades 12a. This allows the cooling medium which has flowed into the first cooling medium flow passage 11 through the inlet port 13a to smoothly spread in the longitudinal direction X and the lateral direction Y in the non-formation region W between the blades 12a and the inlet port 13a. Thereafter, the cooling medium flows through between the adjacent blades 12a to spread over the entire lower surface of the cold plate 10. This makes it possible to suppress unevenness of cooling of the cold plate 10. Note that although in the present example embodiment, the bent portions 14c and 14d are provided on both sides of the inlet port 13a, one of the bent portions 14c and 14d may be omitted.

The bent portions 14a and 14b are provided on both sides of the outlet port 13b in the direction in which the blades 25 are arranged and the first cooling medium flow passage 11 is formed to become narrower in the horizontal direction as extending from the ends of the blade 12a toward the outlet port 13b. This allows the cooling medium which has flowed through between the plurality of blades 12a to smoothly flow toward the outlet port 13b. Note that although in the present example embodiment, the bent portions 14a and 14b are provided on both sides of the outlet port 13b, one of the bent portions 14a and 14b may be omitted.

The heat-generating component H comes into contact with the lower surface of the bottom wall portion 12 (see FIG. 3). At this time, the heat-generating component H is preferably disposed on the lower surface of the bottom wall portion 12 facing the first cooling medium flow passage 11 in the vertical direction. Since the heat-generating component H and the first cooling medium flow passage 11 are disposed to face each other in the vertical direction, it is possible to efficiently transmit the heat generated by the heat-generating component H to the cooling medium flowing through the first cooling medium flow passage 11.

The heat-generating component H is more preferably positioned below the region where the blades 12a are disposed. That is, the heat-generating component H is positioned inside the width of the blades 12a in the longitudinal direction X in which the blades 12a extend and inside the arrangement width of the blades 12a in the lateral direction Y in which the blades 12a are arranged. Disposing the heat-generating component H at a position over the above-described region makes it possible to more efficiently cool the heat-generating component H. The bottom wall portion 12 has a higher strength in the above-described region, thus preventing the bottom wall portion 12 from being deformed.

The heat-generating component H is more preferably disposed at a position over the line connecting the inlet port 13a and the outlet port 13b. The cooling medium circulating in the cooling device 1 is cooled by the radiator 20 near the line connecting the inlet port 13a and the outlet port 13b. For this reason, disposing the heat-generating component H on the above-described line makes it possible to more efficiently cool the heat-generating component H.

A heat-generating component such as a CPU to be cooled is brought into contact with the lower surface of the bottom wall portion 12 of the cold plate 10 and the pump 30 is driven. This causes the cooling medium to circulate through the first cooling medium flow passage 11, the first tank 41, the second cooling medium flow passage 22, and the second tank 42 in this order. Heat generated by the heat-generating component is transmitted to the bottom wall portion 12 of the cold plate 10. The heat transmitted to the bottom wall portion 12 is then transmitted to the fins 21 through the top wall portion 13 and also transmitted to the fins 21 through the cooling medium flowing through the first cooling medium flow passage 11 and the second cooling medium flow passage 22. In this way, the heat is dissipated through the fins 21, so that an increase in temperature of the heat-generating component can be suppressed.

It is possible to further improve the cooling performance of the radiator 20 by disposing a cooling fan (not illustrated) at the lateral side of the radiator 20 to send a cooling air in the direction in which the fins 21 extend (the lateral direction Y), promoting the heat dissipation from the fins 21.

The above-described example embodiment is merely an example of the present disclosure. The configuration of the example embodiment may be modified as appropriate within the scope of the technical idea of the present disclosure. The example embodiments may be combined to be implemented within a possible range.

Although the centrifugal pump 30 is used in the above-described example embodiment, a diaphragm or cascade pump or the like may be used, for example. Although the inlet port 30a and the outlet port 30b penetrate the top wall portion 13 in the vertical direction, these ports may penetrate the side wall portion 14 in the horizontal direction.

The motor of the present disclosure can be utilized in a cooling device for cooling an electronic component such as a microcomputer.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A cooling plate, comprising:
    a bottom wall portion with a lower surface which comes into contact with a heat-generating component;
    a top wall portion which covers an upper surface of the bottom wall portion;
    a side wall portion which couples the bottom wall portion and the top wall portion; and
    an internal space which is surrounded by the bottom wall portion, the top wall portion, and the side wall portion to define a first cooling medium flow passage; wherein
    the bottom wall portion includes blades on the upper surface;
    an inlet port or an outlet port is provided on one end side of the first cooling medium flow passage;
    an inner peripheral wall of the side wall portion includes a first bent portion which is bent convexly inward between ends of the blades and the inlet port or the outlet port;
    the side wall portion includes a step portion which is depressed outward, on a lower end portion of the inner peripheral wall;
    the upper surface of the bottom wall portion contacts a lower surface of the step portion; and
    a lower end surface of the side wall portion and the lower surface of the bottom wall portion are provided at a same height in an up-and-down direction.

2. The cooling plate according to claim 1, wherein the first bent portion is bent in a curved shape when seen in a top view.

3. The cooling plate according to claim 1, wherein the first bent portion is on two sides of the inlet port or the outlet port in a direction in which the blades are positioned.

4. The cooling plate according to claim 1, wherein the inner peripheral wall of the side wall portion includes a second bent portion which is bent convexly inward between other ends of the blades and the inlet port or the outlet port.

5. The cooling plate according to claim 4, wherein the second bent portion is bent in a curved shape when seen in a top view.

6. The cooling plate according to claim 4, wherein the second bent portion is on two sides of the inlet port or the outlet port in a direction in which the blades are positioned.

7. The cooling plate according to claim 6, wherein the second bent portion is symmetrical in a side-to-side direction with the inlet port or the outlet port between ends of the second bent portion when seen in a top view.

8. The cooling plate according to claim 4, wherein the first cooling medium flow passage becomes wider in a side-to-side direction as the first cooling medium flow passage extends from the inlet port or the outlet port towards the other ends of the blades.

9. The cooling plate according to claim 1, wherein the first cooling medium flow passage becomes narrower in a side-to-side direction as the first cooling mechanism extends from first ends of the blades toward the inlet port or the outlet port.

10. The cooling plate according to claim 1, wherein upper ends of the blades contact the lower surface of the top wall portion.

11. The cooling plate according to claim 1, wherein the at inlet port or the outlet port is off-center relative to the blades in the side-to-side direction.

12. A cooling plate, comprising:
    a bottom wall portion with a lower surface which comes into contact with a heat-generating component;

a top wall portion which covers an upper surface of the bottom wall portion;
a side wall portion which couples the bottom wall portion and the top wall portion; and
an internal space which is surrounded by the bottom wall portion, the top wall portion, and the side wall portion to define a first cooling medium flow passage;
a blade region on a top surface of the bottom wall in which blades are provided; and
a non-forming region on the top surface of the bottom wall corresponding to all remaining portions of the top surface in which none of the blades are provided; wherein
the non-forming region includes a first inclined portion that narrows in a side-to-side direction as the non-forming region extends away from one end of the blades;
the side wall portion includes a step portion which is depressed outward, on a lower end portion of an inner peripheral wall of the side wall portion;
the upper surface of the bottom wall portion contacts a lower surface of the step portion; and
a lower end surface of the side wall portion and the lower surface of the bottom wall portion are provided at a same height in an up-and-down direction.

13. The cooling plate according to claim 12, wherein ends of the first inclined portion are provided on two sides of the bottom wall portion in a direction in which the blades are positioned.

14. The cooling plate according to claim 12, wherein the non-forming region includes a second inclined portion which narrows in the side-to-side direction as the second inclined portion extends away from other ends of the blade.

15. The cooling plate according to claim 12, wherein ends of the second inclined portion are provided on two sides of the bottom wall portion in a direction in which the blades are positioned.

16. The cooling plate according to claim 15, wherein the second inclined portion is symmetrical in the side-to-side direction when seen in a top view.

17. A liquid cooling module, comprising:
a pump; and
the cooling plate of claim 1.

18. A liquid cooling module, comprising:
a pump; and
the cooling plate of claim 14.

* * * * *